United States Patent
Bathan et al.

(10) Patent No.: US 8,203,214 B2
(45) Date of Patent: Jun. 19, 2012

(54) INTEGRATED CIRCUIT PACKAGE IN PACKAGE SYSTEM WITH ADHESIVELESS PACKAGE ATTACH

(75) Inventors: Henry Descalzo Bathan, Singapore (SG); Zigmund Ramirez Camacho, Singapore (SG); Lionel Chien Hui Tay, Singapore (SG); Jeffrey D. Punzalan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 833 days.

(21) Appl. No.: 11/769,691

(22) Filed: Jun. 27, 2007

(65) Prior Publication Data

US 2009/0001563 A1   Jan. 1, 2009

(51) Int. Cl.
*H01L 23/52* (2006.01)
*H01L 23/48* (2006.01)
*H01L 29/40* (2006.01)

(52) U.S. Cl. .......... 257/777; 257/E25.018; 257/686; 257/723; 438/108; 438/109; 361/760

(58) Field of Classification Search ........... 257/E21.505, 257/E23.01, 723, 724, 777, 684–686, 690, 257/700, E25.013, E25.018, 692–694, 666, 257/670, 672, 676; 438/106–109, 111, 112; 361/760

See application file for complete search history.

(56) References Cited

U.S. PATENT DOCUMENTS

| | | | |
|---|---|---|---|
| 5,273,938 A * | 12/1993 | Lin et al. | 438/107 |
| 5,366,933 A * | 11/1994 | Golwalkar et al. | 29/827 |
| 5,646,829 A * | 7/1997 | Sota | 361/813 |
| 6,069,025 A * | 5/2000 | Kim | 438/109 |
| 6,118,184 A * | 9/2000 | Ishio et al. | 257/787 |
| 6,316,838 B1 * | 11/2001 | Ozawa et al. | 257/778 |
| 6,344,687 B1 * | 2/2002 | Huang et al. | 257/724 |
| 6,559,539 B2 * | 5/2003 | Tu et al. | 257/723 |
| 6,661,084 B1 | 12/2003 | Peterson et al. | |
| 6,674,159 B1 | 1/2004 | Peterson et al. | |
| 6,747,361 B2 * | 6/2004 | Ichinose | 257/784 |
| 6,762,488 B2 * | 7/2004 | Maeda et al. | 257/686 |
| 6,781,243 B1 * | 8/2004 | Li et al. | 257/777 |
| 6,818,999 B2 * | 11/2004 | Kikuma et al. | 257/777 |
| 6,821,817 B1 * | 11/2004 | Thamby et al. | 438/112 |
| 6,879,028 B2 * | 4/2005 | Gerber et al. | 257/676 |
| 7,053,477 B2 | 5/2006 | Karnezos et al. | |
| 7,071,545 B1 * | 7/2006 | Patel et al. | 257/686 |
| 7,170,158 B2 * | 1/2007 | Choi et al. | 257/686 |
| 7,193,309 B2 * | 3/2007 | Huang et al. | 257/686 |
| 7,298,038 B2 * | 11/2007 | Filoteo et al. | 257/686 |
| 7,531,383 B2 * | 5/2009 | Lo et al. | 438/109 |
| 7,642,633 B2 * | 1/2010 | Hirose et al. | 257/686 |
| 2002/0100165 A1 | 8/2002 | Glenn | |
| 2003/0178716 A1 * | 9/2003 | Maeda et al. | 257/686 |
| 2006/0102994 A1 * | 5/2006 | Pu | 257/686 |
| 2007/0170570 A1 * | 7/2007 | Camacho et al. | 257/686 |

* cited by examiner

*Primary Examiner* — Chris Chu (74) *Attorney, Agent, or Firm* — Ishimaru & Associates LLP; Mikio Ishimaru; Stanley Chang (57) ABSTRACT

An integrated circuit package in package system includes a package in package lead with a package in package lead surface substantially planar, attaching a first integrated circuit package having a first encapsulant surface substantially coplanar with the package in package lead surface, attaching a second integrated circuit near the first integrated circuit package, and forming a package in package encapsulant over the first integrated circuit package and the second integrated circuit.

20 Claims, 5 Drawing Sheets

INTEGRATED CIRCUIT PACKAGE IN PACKAGE SYSTEM WITH ADHESIVELESS PACKAGE ATTACH

TECHNICAL FIELD

The present invention relates generally to integrated circuit package systems, and more particularly to a system for integrated circuit packages with package in package.

BACKGROUND ART

Modern consumer electronics particularly personal portable devices, such as cellular phones, digital cameras, and music players, require increasing integrated circuit chip content to fit an ever-shrinking physical space as well as increasing performance.

The demands for smaller, higher performance semiconductor devices have motivated the development of new techniques for producing smaller and less expensive semiconductor devices. One of these technologies involves packaging the integrated circuit chip in as small a form factor as possible and manufacturing the integrated circuit chip as efficiently as possible.

Usually, many individual devices are constructed on the same wafer. When the devices are separated into individual rectangular units, each takes the form of an integrated circuit chip. In order to interface a chip with other circuitry, it is common to mount it with lead fingers and individually connect pad on the chip to the lead fingers using extremely fine wires. The assemblies are then packaged by individually encapsulating them in molded plastic or ceramic bodies.

Integrated circuit packaging technology has shown an increase in the number of chips mounted on a single circuit board or substrate that parallels the reduction in the number of components needed for a circuit. This results in packaging designs that are more compact, in the physical size and shape of a device, and in a significant increase in overall integrated circuit density. However, integrated circuit density continues to be limited by the area available for mounting chips on a substrate.

To condense the packaging of individual devices, packages have been developed in which more than one device can be packaged at one time at each package site. Each package site is a structure that provides mechanical support for the individual integrated circuit devices. It also provides one or more layers of interconnect lines that enable the devices to be connected electrically to surrounding circuitry.

In some cases, multi-chip devices can be fabricated faster and more cheaply than a corresponding single integrated circuit chip, that incorporates all the same functions. Some multi-chip modules have been found to increase circuit density and miniaturization, improve signal propagation speed, reduce overall device size, improve performance, and lower costs.

However, such multi-chip modules can be bulky. Package density is determined by the area required to mount a chip or module on a circuit board. One method for reducing the board size of multi-chip modules and thereby increase their effective density is to stack the chips vertically within the module or package. Such designs are improvements over prior packages that combined several chips and associated passive components side by side in a single, horizontal layer.

However, multi-chip modules, whether vertically or horizontally arranged, can also present problems because they usually must be assembled before the chips and chip connections can be tested. That is, because the electrical bond pads on a chip are so small, it is difficult to test chips before assembly into a package.

When chips are mounted and connected individually, the chip and connections can be tested, and a known-good-unit ("KGU") free of defects is then assembled into larger circuits. A fabrication process that uses KGU is therefore more reliable and less prone to assembly defects introduced due to bad chips. With conventional multi-chip modules, the chip cannot be individually identified as KGU before final assembly.

Despite the advantages of recent developments in semiconductor fabrication and packaging techniques, there is a continuing need for improving packaging methods, systems, and designs.

Thus, a need still remains for an integrated circuit package in package system to provide a lower profile, increase the number of devices in a package system, and reduce delamination, adhesive, and adhesion failures. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a package in package lead with a package in package lead surface substantially planar, attaching a first integrated circuit package having a first encapsulant surface substantially coplanar with the package in package lead surface, attaching a second integrated circuit near the first integrated circuit package, and forming a package in package encapsulant over the first integrated circuit package and the second integrated circuit.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGS.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure.

The term "system" as used herein means and refers to the method and to the apparatus of the present invention in accordance with the context in which the term is used.

Figure 1:
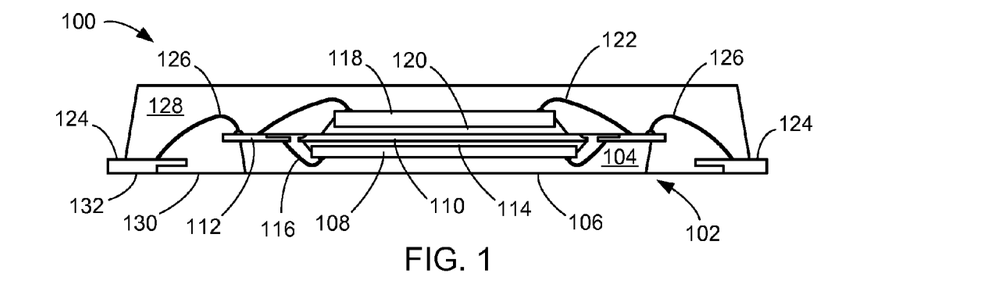
FIG. 1 is a cross-sectional view of an integrated circuit package in package system taken along line 1-1 of FIG. 2 in an embodiment of the present invention.
Figure 2:
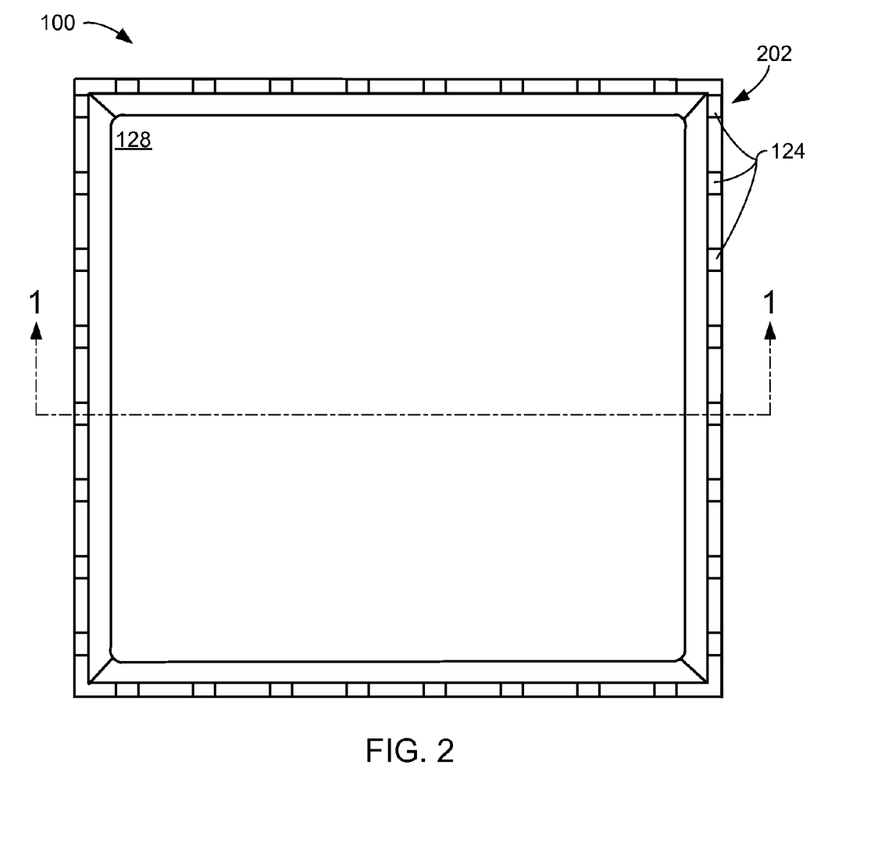
FIG. 2 is a top plan view of the integrated circuit package in package system.

Referring now to FIG. 1, therein is shown a cross-sectional view of an integrated circuit package in package system 100 taken along line 1-1 of FIG. 2 in an embodiment of the present invention. The integrated circuit package in package system 100 preferably includes a first integrated circuit package 102 having a first encapsulant 104. The first encapsulant 104 of the first integrated circuit package 102 can include a first encapsulant surface 106 preferably formed having a substantially planar surface.

The first integrated circuit package 102 includes a first package integrated circuit 108, a first package die pad 110, and a first package lead 112. The first encapsulant surface 106 can be formed over the first package integrated circuit 108, the first package die pad 110, and the first package lead 112. The first package integrated circuit 108 can be mounted over the first package die pad 110 with a first package mounting layer 114 such as an adhesive layer. The first package integrated circuit 108 can be electrically connected to the first package lead 112 with a first package connector 116 such as a bond wire. The first package lead 112 protrudes from the first encapsulant 104.

The integrated circuit package in package system 100 also preferably includes a second integrated circuit 118. The second integrated circuit 118 can be mounted over the first integrated circuit package 102 with a second mounting layer 120 such as an adhesive. The second integrated circuit 118 can be electrically connected to the first integrated circuit package 102 with a second connector 122 such as a bond wire.

The first integrated circuit package 102 can preferably be attached to the integrated circuit package in package system 100 without the need for adhesives for an adhesiveless package attach. The first integrated circuit package 102 and thereby the second integrated circuit 118 can be electrically connected to a package in package lead 124 with a package in package connector 126 such as a bond wire. The package in package lead 124 preferably provides a connection to a next level system such as another package or printed circuit board.

The integrated circuit package in package system 100 preferably includes a package in package encapsulant 128. The package in package encapsulant 128 can provide structural integrity and protection for the first integrated circuit package 102, the second integrated circuit 118, the second connector 122, the package in package connector 126, and a portion of the package in package lead 124. The first encapsulant surface 106 can be substantially coplanar to a plane formed by a package in package mounting surface 130 of the package in package encapsulant 128 and a package in package lead surface 132 of the package in package lead 124.

For illustrative purposes, the integrated circuit package in package system 100 is shown having one of the first integrated circuit package 102 and one of the second integrated circuit 118 although it is understood that any number of the first integrated circuit package 102 or the second integrated circuit 118 may be used. For example, two of the first integrated circuit package 102 with the second integrated circuit 118 mounted over each of the first integrated circuit package 102 can be adjacent and interconnected to each other. As would be obvious to one of ordinary skill in the art, any of the embodiments of the integrated circuit package in package system 100 may include any number of the first integrated circuit package 102 or the second integrated circuit 118.

It has been discovered that the integrated circuit package in package system 100 with adhesiveless package attach eliminates the need for another die attach paddle or an adhesive bondline significantly improving vertical space or size and providing a lower profile package. Further, the integrated circuit package in package system 100 significantly simplifies processing and eliminates process control complexity significantly increasing the number of devices a process can integrate into a package in package system. Yet further, the integrated circuit package in package system 100 significantly reduces coefficient of thermal expansion (CTE) mismatches from the adhesive layers significantly reducing delamination, adhesive, and adhesion failures.

Referring now to FIG. 2 therein is shown a top plan view of the integrated circuit package in package system 100. The integrated circuit package in package system 100 preferably includes the package in package encapsulant 128 and the package in package lead 124. The package in package lead 124 can optionally extend beyond the extents of the package in package encapsulant 128.

An exposed portion 202 of the package in package lead 124 can provide electrical connectivity to the next level system. The exposed portion 202 can preferably extend to the package in package lead surface 132 of FIG. 1 adjacent the package in package mounting surface 130 of FIG. 1. The exposed portion 202 can optionally provide a interference fit such as in a socket, a soldered connection such as on a surface mount, or a bonding surface such as a for a bond wire.

For illustrative purposes the integrated circuit package in package system 100 is shown having a solid flange near the exposed portion 202, as in a standard quad flat no-lead (QFN), although it is understood that the integrated circuit package in package system 100 may be formed differently such as a sawn type QFN package or a protruded lead QFN.

Further, for illustrative purposes, the integrated circuit package in package system 100 is shown in a shape of a square although it is understood that the integrated circuit package in package system 100 may be any shape. Yet further, for illustrative purposes, the integrated circuit package in package system 100 is shown having eight of the package in package lead 124 on each side although it is understood that the integrated circuit package in package system 100 may include any number of the package in package lead 124.

Figure 3:
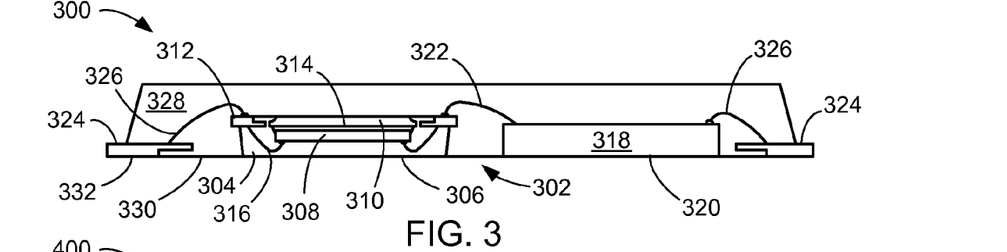
FIG. 3 is a cross-sectional view of an integrated circuit package in package system in a first embodiment of the present invention.

Referring now to FIG. 3, therein is shown a cross-sectional view of an integrated circuit package in package system 300 in a first embodiment of the present invention. The integrated circuit package in package system 300 preferably includes a first integrated circuit package 302 having a first encapsulant 304. The first encapsulant 304 of the first integrated circuit package 302 can include a first encapsulant surface 306 preferably formed having a substantially planar surface.

The first encapsulant surface 306 can be formed over a first package integrated circuit 308, a first package die pad 310, and a first package lead 312. The first package integrated circuit 308 can be mounted over the first package die pad 310 with a first package mounting layer 314 such as an adhesive layer. The first package integrated circuit 308 can be electrically connected to the first package lead 312 with a first package connector 316 such as a bond wire.

The integrated circuit package in package system 300 also preferably includes a second integrated circuit 318. The second integrated circuit 318 can be mounted adjacent the first integrated circuit package 302 without the need for a mounting layer such as an adhesive. A second integrated circuit mounting surface 320 can be substantially planar. The second integrated circuit 318 can be electrically connected to the first integrated circuit package 302 with a second connector 322 such as a bond wire.

The first integrated circuit package 302 can preferably be attached to the integrated circuit package in package system 300 without the need for adhesives for an adhesiveless package attach. The first integrated circuit package 302 and the second integrated circuit 318 can be electrically connected to a package in package lead 324 with a package in package connector 326 such as a bond wire. The package in package lead 324 preferably provides a connection to a next level system such as another package or printed circuit board.

The integrated circuit package in package system 300 preferably includes a package in package encapsulant 328. The package in package encapsulant 328 can provide structural integrity and protection for the first integrated circuit package 302, the second integrated circuit 318, the second connector 322, the package in package connector 326, and a portion of the package in package lead 324. The first encapsulant surface 306 and the second integrated circuit mounting surface 320 can be substantially coplanar to a plane formed by a package in package mounting surface 330 of the package in package encapsulant 328 and a package in package lead surface 332 of the package in package lead 324.

Figure 4:
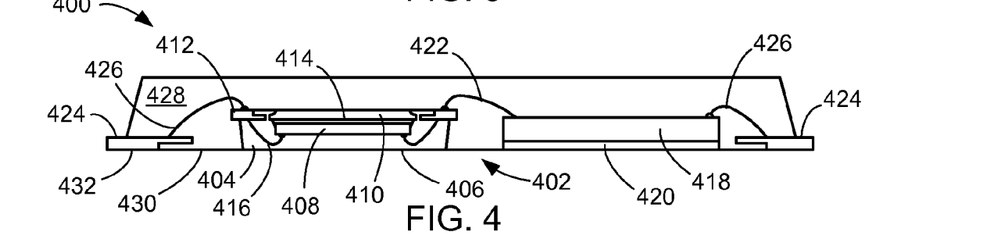
FIG. 4 is a cross-sectional view of an integrated circuit package in package system in a second embodiment of the present invention.

Referring now to FIG. 4, therein is shown a cross-sectional view of an integrated circuit package in package system 400 in a second embodiment of the present invention. Similar to the integrated circuit package in package system 300, the integrated circuit package in package system 400 preferably includes a first integrated circuit package 402 having a first encapsulant 404. The first encapsulant 404 of the first integrated circuit package 402 can include a first encapsulant surface 406 preferably formed having a substantially planar surface.

The first encapsulant surface 406 can be formed over a first package integrated circuit 408, a first package die pad 410, and a first package lead 412. The first package integrated circuit 408 can be mounted over the first package die pad 410 with a first package mounting layer 414 such as an adhesive layer. The first package integrated circuit 408 can be electrically connected to the first package lead 412 with a first package connector 416 such as a bond wire.

The integrated circuit package in package system 400 also preferably includes a second integrated circuit 418. The second integrated circuit 418 can be mounted adjacent the first integrated circuit package 402 without the need for a mounting layer such as an adhesive. A die concealer 420 can be applied to the second integrated circuit 418. The second integrated circuit 418 can be electrically connected to the first integrated circuit package 402 with a second connector 422 such as a bond wire.

The first integrated circuit package 402 can preferably be attached to the integrated circuit package in package system 400 without the need for adhesives for an adhesiveless package attach. The first integrated circuit package 402 and the second integrated circuit 418 can be electrically connected to a package in package lead 424 with a package in package connector 426 such as a bond wire. The package in package lead 424 preferably provides a connection to a next level system such as another package or printed circuit board.

The integrated circuit package in package system 400 preferably includes a package in package encapsulant 428. The package in package encapsulant 428 can provide structural integrity and protection for the first integrated circuit package 402, the second integrated circuit 418, the second connector 422, the package in package connector 426, and a portion of the package in package lead 424. The first encapsulant surface 406 and a surface of the die concealer 420 opposite the second integrated circuit 418 can be substantially coplanar to a plane formed by a package in package mounting surface 430 of the package in package encapsulant 428 and a package in package lead surface 432 of the package in package lead 424.

Figure 5:
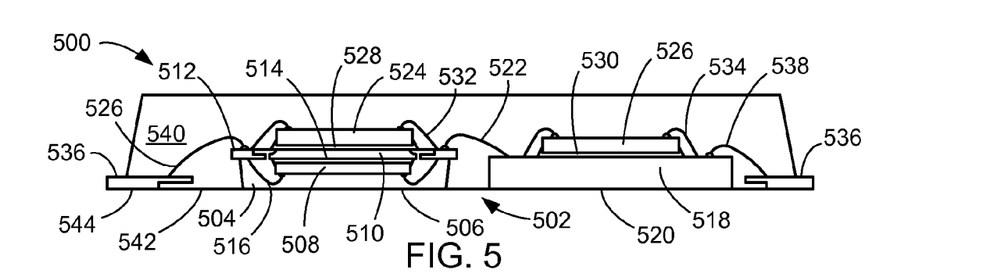
FIG. 5 is a cross-sectional view of an integrated circuit package in package system in a third embodiment of the present invention.

Referring now to FIG. 5, therein is shown a cross-sectional view of an integrated circuit package in package system 500 in a third embodiment of the present invention. The integrated circuit package in package system 500 preferably includes a first integrated circuit package 502 having a first encapsulant 504. The first encapsulant 504 of the first integrated circuit package 502 can include a first encapsulant surface 506 preferably formed having a substantially planar surface.

The first encapsulant surface 506 can be formed over a first package integrated circuit 508, a first package die pad 510, and a first package lead 512. The first package integrated circuit 508 can be mounted over the first package die pad 510 with a first package mounting layer 514 such as an adhesive layer. The first package integrated circuit 508 can be electrically connected to the first package lead 512 with a first package connector 516 such as a bond wire.

The integrated circuit package in package system 500 also preferably includes a second integrated circuit 518. The second integrated circuit 518 can be mounted adjacent the first integrated circuit package 502 without the need for a mounting layer such as an adhesive. A second integrated circuit mounting surface 520 can be substantially planar. The second integrated circuit 518 can be electrically connected to the first integrated circuit package 502 with a second connector 522 such as a bond wire.

The integrated circuit package in package system 500 can also include a third integrated circuit 524 over the first integrated circuit package 502 and a fourth integrated circuit 526 over the second integrated circuit 518. The third integrated circuit 524 can be mounted with a third mounting layer 528 and the fourth integrated circuit 526 can be mounted with a fourth mounting layer 530. A third connector 532 can connect the third integrated circuit 524 and the first integrated circuit package 502. A fourth connector 534 can electrically connect the fourth integrated circuit 526 and the second integrated circuit 518.

The first integrated circuit package 502 can preferably be attached to the integrated circuit package in package system 500 without the need for adhesives for an adhesiveless package attach. The first integrated circuit package 502 and the second integrated circuit 518 can be electrically connected to a package in package lead 536 with a package in package connector 538 such as a bond wire. The package in package lead 536 preferably provides a connection to a next level system such as another package or printed circuit board.

The integrated circuit package in package system 500 preferably includes a package in package encapsulant 540. The package in package encapsulant 540 can provide structural integrity and protection for the first integrated circuit package 502, the second integrated circuit 518, the second connector 522, the package in package connector 538, and a portion of the package in package lead 536. The first encapsulant surface 506 and the second integrated circuit mounting surface 520 can be substantially coplanar to a plane formed by a package in package mounting surface 542 of the package in package encapsulant 540 and a package in package lead surface 544 of the package in package lead 536.

Figure 6:
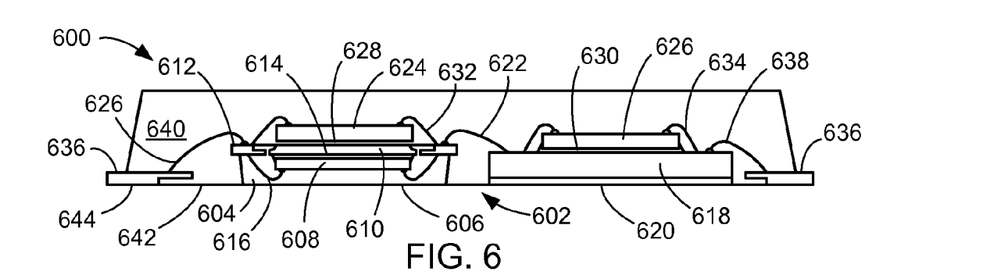
FIG. 6 is a cross-sectional view of an integrated circuit package in package system in a fourth embodiment of the present invention.

Referring now to FIG. 6, therein is shown a cross-sectional view of an integrated circuit package in package system 600 in a fourth embodiment of the present invention. Similar to the integrated circuit package in package system 500, the integrated circuit package in package system 600 preferably includes a first integrated circuit package 602 having a first encapsulant 604. The first encapsulant 604 of the first integrated circuit package 602 can include a first encapsulant surface 606 preferably formed having a substantially planar surface.

The first encapsulant surface 606 can be formed over a first package integrated circuit 608, a first package die pad 610, and a first package lead 612. The first package integrated circuit 608 can be mounted over the first package die pad 610 with a first package mounting layer 614 such as an adhesive layer. The first package integrated circuit 608 can be electrically connected to the first package lead 612 with a first package connector 616 such as a bond wire.

The integrated circuit package in package system 600 also preferably includes a second integrated circuit 618. The second integrated circuit 618 can be mounted adjacent the first integrated circuit package 602 without the need for a mounting layer such as an adhesive. A die concealer 620 can be applied to the second integrated circuit 618. The second integrated circuit 618 can be electrically connected to the first integrated circuit package 602 with a second connector 622 such as a bond wire.

The integrated circuit package in package system 600 can also include a third integrated circuit 624 over the first integrated circuit package 602 and a fourth integrated circuit 626 over the second integrated circuit 618. The third integrated circuit 624 can be mounted with a third mounting layer 628 and the fourth integrated circuit 626 can be mounted with a fourth mounting layer 630. A third connector 632 can connect the third integrated circuit 624 and the first integrated circuit package 602. A fourth connector 634 can electrically connect the fourth integrated circuit 626 and the second integrated circuit 618.

The first integrated circuit package 602 can preferably be attached to the integrated circuit package in package system 600 without the need for adhesives for an adhesiveless package attach. The first integrated circuit package 602 and the second integrated circuit 618 can be electrically connected to a package in package lead 636 with a package in package connector 638 such as a bond wire. The package in package lead 636 preferably provides a connection to a next level system such as another package or printed circuit board.

The integrated circuit package in package system 600 preferably includes a package in package encapsulant 640. The package in package encapsulant 640 can provide structural integrity and protection for the first integrated circuit package 602, the second integrated circuit 618, the second connector 622, the package in package connector 638, and a portion of the package in package lead 636. The first encapsulant surface 606 and a surface of the die concealer 620 opposite the second integrated circuit 618 can be substantially coplanar to a plane formed by a package in package mounting surface 642 of the package in package encapsulant 640 and a package in package lead surface 644 of the package in package lead 636.

Figure 7:
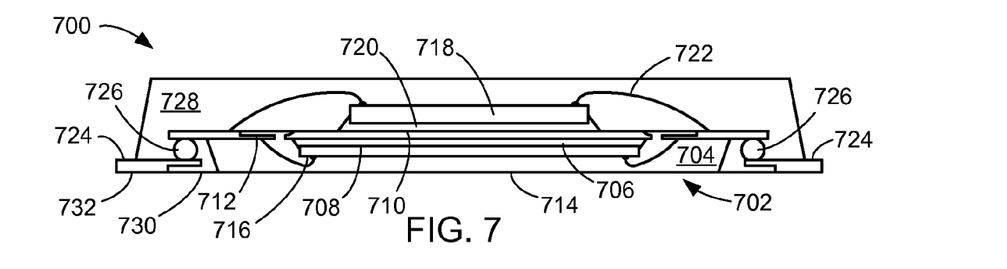
FIG. 7 is a cross-sectional view of an integrated circuit package in package system in a fifth embodiment of the present invention.

Referring now to FIG. 7, therein is shown a cross-sectional view of an integrated circuit package in package system 700 in a fifth embodiment of the present invention. Similar to the integrated circuit package in package system 100, the integrated circuit package in package system 700 preferably includes a first integrated circuit package 702 having a first encapsulant 704. The first encapsulant 704 of the first integrated circuit package 702 can include a first encapsulant surface 706 preferably formed having a substantially planar surface.

The first encapsulant surface 706 can be formed over a first package integrated circuit 708, a first package die pad 710, and a first package lead 712. The first package integrated circuit 708 can be mounted over the first package die pad 710 with a first package mounting layer 714 such as an adhesive layer. The first package integrated circuit 708 can be electrically connected to the first package lead 712 with a first package connector 716 such as a bond wire.

The integrated circuit package in package system 700 also preferably includes a second integrated circuit 718. The second integrated circuit 718 can be mounted over the first integrated circuit package 702 with a second mounting layer 720 such as an adhesive. The second integrated circuit 718 can be electrically connected to the first integrated circuit package 702 with a second connector 722 such as a bond wire.

The first integrated circuit package 702 can preferably be attached to the integrated circuit package in package system 700 without the need for adhesives for an adhesiveless package attach. The first integrated circuit package 702 and thereby the second integrated circuit 718 can be electrically connected to a package in package lead 724 with a package in package connector 726 such as a solder bump or ball. The package in package lead 724 preferably provides a connection to a next level system such as another package or printed circuit board.

The integrated circuit package in package system 700 preferably includes a package in package encapsulant 728. The package in package encapsulant 728 can provide structural integrity and protection for the first integrated circuit package 702, the second integrated circuit 718, the second connector 722, the package in package connector 726, and a portion of the package in package lead 724. The first encapsulant surface 706 can be substantially coplanar to a plane formed by a package in package mounting surface 730 of the package in package encapsulant 728 and a package in package lead surface 732 of the package in package lead 724.

Figure 8:
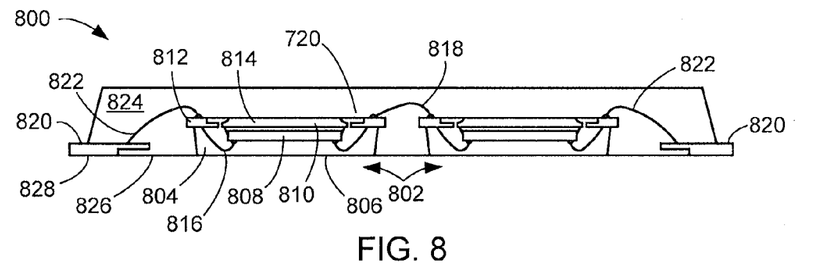
FIG. 8 is a cross-sectional view of an integrated circuit package in package system in a sixth embodiment of the present invention.

Referring now to FIG. 8, therein is shown a cross-sectional view of an integrated circuit package in package system 800 in a sixth embodiment of the present invention. The integrated circuit package in package system 800 preferably includes an integrated circuit package 802 having a package encapsulant 804. The package encapsulant 804 of the integrated circuit package 802 can include a package encapsulant surface 806 preferably formed having a substantially planar surface.

The package encapsulant surface 806 can be formed over a package integrated circuit 808, a package die pad 810, and a package lead 812. The package integrated circuit 808 can be mounted over the package die pad 810 with a package mounting layer 814 such as an adhesive layer. The package integrated circuit 808 can be electrically connected to the package lead 812 with a package connector 816 such as a bond wire.

An interconnect 818 such as a bond wire can connect two or more of the integrated circuit package 802. The interconnect 818 can provide electrical connectivity between two or more of the integrated circuit package 802 or electrical connectivity through one or more of the integrated circuit package 802.

The integrated circuit package 802 can preferably be attached to the integrated circuit package in package system 800 without the need for adhesives for an adhesiveless package attach. The integrated circuit package 802 can be electrically connected to a package in package lead 820 with a package in package connector 822 such as a bond wire. The package in package lead 820 preferably provides a connection to a next level system such as another package or printed circuit board.

The integrated circuit package in package system 800 preferably includes a package in package encapsulant 824. The package in package encapsulant 824 can provide structural integrity and protection for the integrated circuit package 802, the interconnect 818, the package in package connector 822, and a portion of the package in package lead 820. The package encapsulant surface 806 can be substantially coplanar to a plane formed by a package in package mounting surface 826 of the package in package encapsulant 824 and a package in package lead surface 828 of the package in package lead 820.

For illustrative purposes, the integrated circuit package in package is shown having two of the integrated circuit package 802, although it is understood that any number of the integrated circuit package 802 may be used.

Figure 9:
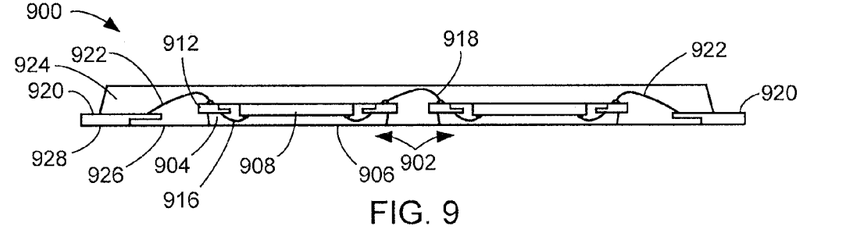
FIG. 9 is a cross-sectional view of an integrated circuit package in package system in a seventh embodiment of the present invention.

Referring now to FIG. 9, therein is shown a cross-sectional view of an integrated circuit package in package system 900 in a seventh embodiment of the present invention. Similar to the integrated circuit package in package system 800, the integrated circuit package in package system 900 preferably includes an integrated circuit package 902 having a package encapsulant 904. The package encapsulant 904 of the integrated circuit package 902 can include a package encapsulant surface 906 preferably formed having a substantially planar surface.

The package encapsulant surface 906 can be formed over a package integrated circuit 908 and a package lead 912. The package integrated circuit 908 can be mounted adjacent to the package lead 912 without the need for adhesives for an adhesiveless package attach. The package integrated circuit 908 can be electrically connected to the package lead 912 with a package connector 916 such as a bond wire.

An interconnect 918 such as a bond wire can connect two or more of the integrated circuit package 902. The interconnect 918 can provide electrical connectivity between two or more of the integrated circuit package 902 or electrical connectivity through one or more of the integrated circuit package 902.

The integrated circuit package 902 can preferably be attached to the integrated circuit package in package system 900 without the need for adhesives for an adhesiveless package attach. The integrated circuit package 902 can be electrically connected to a package in package lead 920 with a package in package connector 922 such as a bond wire. The package in package lead 920 preferably provides a connection to a next level system such as another package or printed circuit board.

The integrated circuit package in package system 900 preferably includes a package in package encapsulant 924. The package in package encapsulant 924 can provide structural integrity and protection for the integrated circuit package 902, the interconnect 918, the package in package connector 922, and a portion of the package in package lead 920. The package encapsulant surface 906 can be substantially coplanar to a plane formed by a package in package mounting surface 926 of the package in package encapsulant 924 and a package in package lead surface 928 of the package in package lead 920.

For illustrative purposes, the integrated circuit package in package is shown having two of the integrated circuit package 902, although it is understood that any number of the integrated circuit package 902 may be used.

Figure 10:
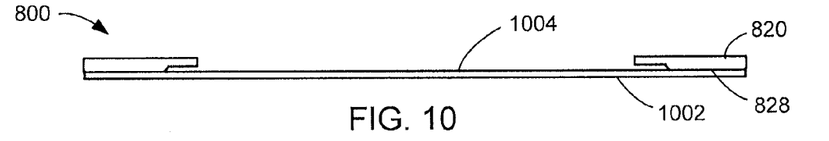
FIG. 10 is a cross-sectional view of the integrated circuit package in package system in a coverlay application phase.

Referring now to FIG. 10, therein is shown a cross-sectional view of the integrated circuit package in package system 800 in a coverlay application phase. A coverlay layer 1002 such as a coverlay tape is applied over two or more of the package in package lead surface 828 of the package in package lead 820. The coverlay layer 1002 provides a coverlay mounting surface 1004 substantially planar to a plane formed by two or more of the package in package lead surface 828.

Figure 11:
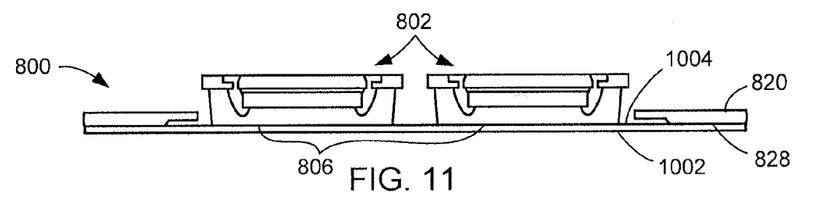
FIG. 11 is a cross-sectional view of the integrated circuit package in package system in an adhesiveless package attach phase.

Referring now to FIG. 11, therein is shown a cross-sectional view of the integrated circuit package in package system 800 in an adhesiveless package attach phase. Two of the integrated circuit packages 802 are mounted over the coverlay mounting surface 1004 of the coverlay layer 1002. The package encapsulant surface 806 of the integrated circuit package 802 is substantially planar to the plane formed by two or more of the package in package lead surface 828 of the package in package lead 820.

Figure 12:
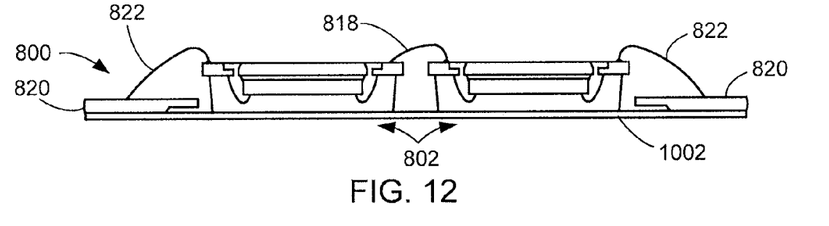
FIG. 12 is a cross-sectional view of the integrated circuit package in package system in an electrical connection phase.

Referring now to FIG. 12, therein is shown a cross-sectional view of the integrated circuit package in package system 800 in an electrical connection phase. The interconnect 818 can electrically connect the integrated circuit package 802 to another of the integrated circuit package 802. The package in package connector 822 can preferably connect one or more of the integrated circuit package 802 to the package in package lead 820 over the coverlay layer 1002.

Figure 13:
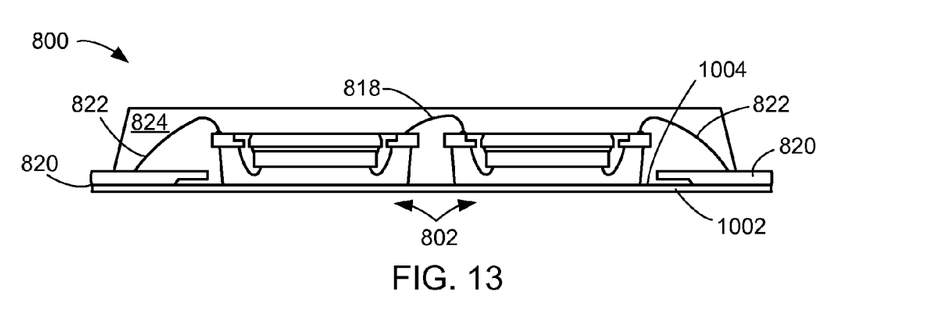
FIG. 13 is a cross-sectional view of the integrated circuit package in package system in a package in package encapsulation phase.

Referring now to FIG. 13, therein is shown a cross-sectional view of the integrated circuit package in package system 800 in a package in package encapsulation phase. The package in package encapsulant 824 can preferably be applied over the integrated circuit package 802, the interconnect 818, and the package in package lead 820 as a cover and for protection. The package in package encapsulant 824 can be applied over a portion of the package in package lead 820 and the coverlay mounting surface 1004 of the coverlay layer 1002.

Figure 14:
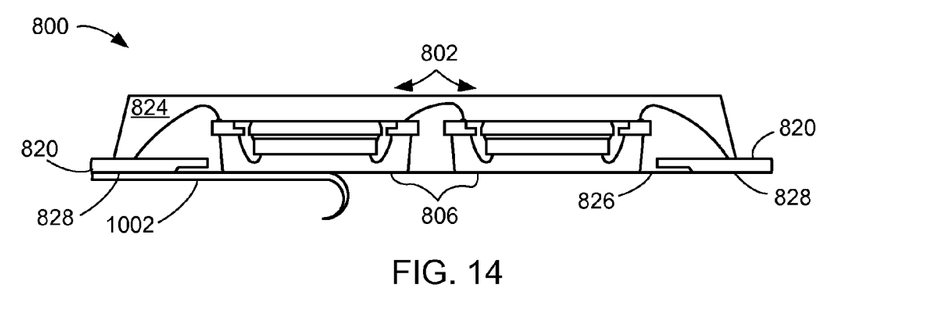
FIG. 14 is a cross-sectional view of the integrated circuit package in package system in a coverlay removal phase.

Referring now to FIG. 14, therein is shown a cross-sectional view of the integrated circuit package in package system 800 in a coverlay removal phase. The coverlay layer 1002 can be removed from the integrated circuit package 802, the package in package lead 820, and the package in package encapsulant 824. The package encapsulant surface 806 of the integrated circuit package 802, the package in package lead surface 828 of the package in package lead 820, and the package in package mounting surface 826 of the package in package encapsulant 824 form a substantially planar surface of the integrated circuit package in package system 800. End of line (EOL) processes can be applied to the integrated circuit package in package system 800.

Figure 15:
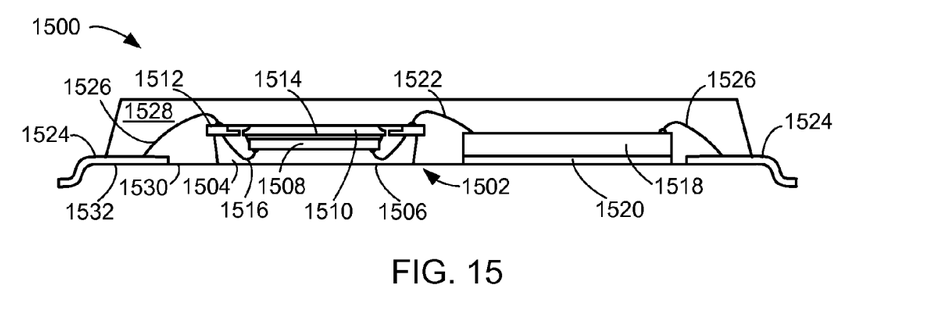
FIG. 15 is a cross-sectional view of an integrated circuit package in package system in an eighth embodiment of the present invention.

Referring now to FIG. 15 therein is shown a cross-sectional view of an integrated circuit package in package system 1500 in an eighth embodiment of the present invention. The integrated circuit package in package system 1500 preferably includes a first integrated circuit package 1502 having a first encapsulant 1504. The first encapsulant 1504 of the first integrated circuit package 1502 can include a first encapsulant surface 1506 preferably formed having a substantially planar surface.

The first encapsulant surface 1506 can be formed over a first package integrated circuit 1508, a first package die pad 1510, and a first package lead 1512. The first package integrated circuit 1508 can be mounted over the first package die pad 1510 with a first package mounting layer 1514 such as an adhesive layer. The first package integrated circuit 1508 can be electrically connected to the first package lead 1512 with a first package connector 1516 such as a bond wire.

The integrated circuit package in package system 1500 also preferably includes a second integrated circuit 1518. The second integrated circuit 1518 can be mounted adjacent the first integrated circuit package 1502 without the need for a mounting layer such as an adhesive. A die concealer 1520 can be applied to the second integrated circuit 1518. The second integrated circuit 1518 can be electrically connected to the first integrated circuit package 1502 with a second connector 1522 such as a bond wire.

The first integrated circuit package 1502 can preferably be attached to the integrated circuit package in package system 1500 without the need for adhesives for an adhesiveless package attach. The first integrated circuit package 1502 and the second integrated circuit 1518 can be electrically connected to a package in package lead 1524, such as a J-bend, with a package in package connector 1526 such as a bond wire. The package in package lead 1524 preferably provides a connection to a next level system such as another package or printed circuit board.

The integrated circuit package in package system 1500 preferably includes a package in package encapsulant 1528. The package in package encapsulant 1528 can provide structural integrity and protection for the first integrated circuit package 1502, the second integrated circuit 1518, the second connector 1522, the package in package connector 1526, and a portion of the package in package lead 1524. The first encapsulant surface 1506 and a surface of the die concealer 1520 opposite the second integrated circuit 1518 can be substantially coplanar to a plane formed by a package in package lower surface 1530 of the package in package encapsulant 1528 and a package in package lead surface 1532 of the package in package lead 1524.

For illustrative purposes the integrated circuit package in package system 1500 is shown having one of the first integrated circuit package 1502 although it is understood that any number of the first integrated circuit package 102 may be used. As would be obvious to one of ordinary skill in the art, any of the embodiments of the integrated circuit package in package system 100 may include the package in package lead 1524 such as the J-bend.

Figure 16:
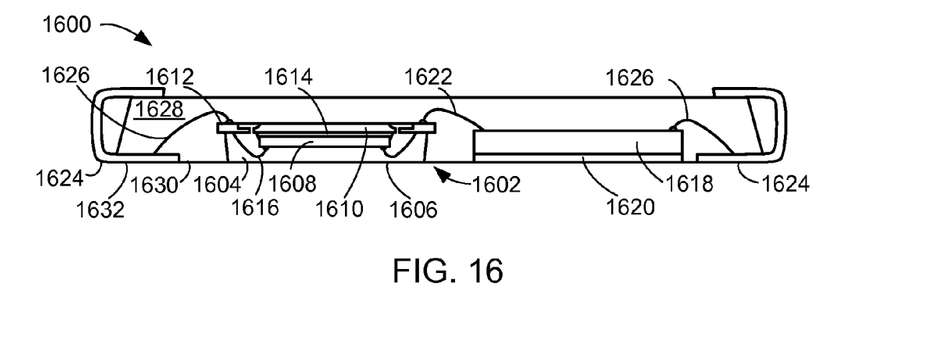
FIG. 16 is a cross-sectional view of an integrated circuit package in package system in a ninth embodiment of the present invention.

Referring now to FIG. 16, therein is shown a cross-sectional view of an integrated circuit package in package system 1600 in a ninth embodiment of the present invention. The integrated circuit package in package system 1600 preferably includes a first integrated circuit package 1602 having a first encapsulant 1604. The first encapsulant 1604 of the first integrated circuit package 1602 can include a first encapsulant surface 1606 preferably formed having a substantially planar surface.

The first encapsulant surface 1606 can be formed over a first package integrated circuit 1608, a first package die pad 1610, and a first package lead 1612. The first package integrated circuit 1608 can be mounted over the first package die pad 1610 with a first package mounting layer 1614 such as an adhesive layer. The first package integrated circuit 1608 can be electrically connected to the first package lead 1612 with a first package connector 1616 such as a bond wire.

The integrated circuit package in package system 1600 also preferably includes a second integrated circuit 1618. The second integrated circuit 1618 can be mounted adjacent the first integrated circuit package 1602 without the need for a mounting layer such as an adhesive. A die concealer 1620 can be applied to the second integrated circuit 1618. The second integrated circuit 1618 can be electrically connected to the first integrated circuit package 1602 with a second connector 1622 such as a bond wire.

The first integrated circuit package 1602 can preferably be attached to the integrated circuit package in package system 1600 without the need for adhesives for an adhesiveless package attach. The first integrated circuit package 1602 and the second integrated circuit 1618 can be electrically connected to a package in package lead 1624, such as a stackable lead having a top terminal and a bottom terminal, with a package in package connector 1626 such as a bond wire. The package in package lead 1624 preferably provides a connection to a next level system such as another package or printed circuit board.

The integrated circuit package in package system 1600 preferably includes a package in package encapsulant 1628. The package in package encapsulant 1628 can provide structural integrity and protection for the first integrated circuit package 1602, the second integrated circuit 1618, the second connector 1622, the package in package connector 1626, and a portion of the package in package lead 1624. The first encapsulant surface 1606 and a surface of the die concealer 1620 opposite the second integrated circuit 1618 can be substantially coplanar to a plane formed by a package in package lower surface 1630 of the package in package encapsulant 1628 and a package in package lead surface 1632 of the package in package lead 1624.

For illustrative purposes the integrated circuit package in package system 1600 is shown having one of the first integrated circuit package 1602 although it is understood that any number of the first integrated circuit package 102 may be used. As would be obvious to one of ordinary skill in the art, any of the embodiments of the integrated circuit package in package system 100 may include the package in package lead 1624 such as a stackable lead having a top terminal and a bottom terminal.

Figure 17:
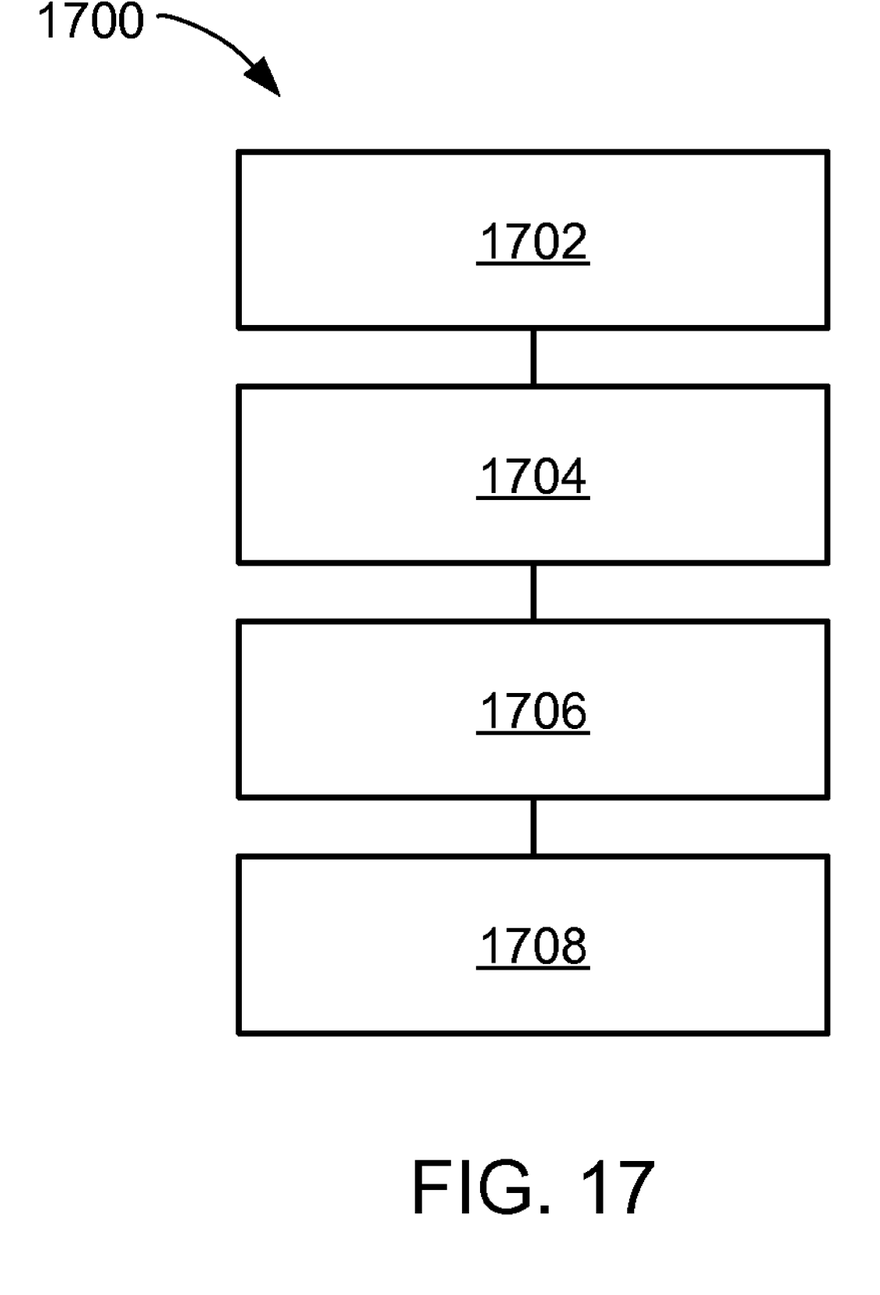
FIG. 17 is a flow chart of an integrated circuit package in package system for manufacturing the integrated circuit package in package system in an embodiment of the present invention.

Referring now to FIG. 17, therein is shown a flow chart of an integrated circuit package in package system 1700 for manufacturing the integrated circuit package in package system 100 in an embodiment of the present invention. The system 1700 includes providing a package in package lead with a package in package lead surface substantially planar in a block 1702; attaching a first integrated circuit package having a first encapsulant surface substantially coplanar with the package in package lead surface in a block 1704; attaching a second integrated circuit near the first integrated circuit package in a block 1706; and forming a package in package encapsulant over the first integrated circuit package and the second integrated circuit in a block 1708.

In greater detail, a system to provide the method and apparatus of the integrated circuit package in package system 100, in an embodiment of the present invention, is performed as follows:

1. Forming a package in package lead having a package in package lead surface substantially planar to another package in package lead.
2. Mounting a first integrated circuit package having a first encapsulant surface substantially coplanar with the package in package lead surface and another package in package lead surface.
3. Connecting a second integrated circuit to the first integrated circuit package with a second connector.
4. Applying a package in package encapsulant over the first integrated circuit package and the second integrated circuit, the package in package encapsulant having a plane of a package in package mounting surface substantially coplanar with the first encapsulant surface and the package in package lead surface.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package in package system comprising:
    providing a package in package lead with a package in package lead surface substantially planar;
    attaching a first integrated circuit package having a first package lead and a first encapsulant having a first encapsulant surface substantially coplanar with the package in package lead surface, the first package lead protruding from the first encapsulant;
    attaching a second integrated circuit near the first integrated circuit package; and
    forming a package in package encapsulant over the first integrated circuit package and the second integrated circuit, a side of the package in package lead opposite the package in package lead surface exposed from the package in package encapsulant.

2. The method as claimed in claim 1 wherein attaching the first integrated circuit package includes electrically connecting the first integrated circuit package to the package in package lead.

3. The method as claimed in claim 1 wherein attaching the second integrated circuit includes attaching the second integrated circuit over the first integrated circuit package.

4. The method as claimed in claim 1 wherein attaching the second integrated circuit includes attaching the second integrated circuit adjacent the first integrated circuit package.

5. The method as claimed in claim 1 wherein attaching the second integrated circuit includes attaching a second integrated circuit package having the second integrated circuit adjacent the first integrated circuit package.

6. A method for manufacturing an integrated circuit package in package system comprising:
    forming a package in package lead having a package in package lead surface substantially planar to another package in package lead;
    mounting a first integrated circuit package having a first package lead and a first encapsulant having a first encapsulant surface substantially coplanar with the package in package lead surface and another package in package lead surface, the first package lead protruding from the first encapsulant;
    connecting a second integrated circuit to the first integrated circuit package with a second connector; and
    applying a package in package encapsulant over the first integrated circuit package and the second integrated circuit, the package in package encapsulant having a plane of a package in package mounting surface substantially coplanar with the first encapsulant surface and the package in package lead surface, and a side of the package in package lead opposite the package in package lead surface exposed from the package in package encapsulant.

7. The method as claimed in claim 6 wherein connecting the second integrated circuit includes connecting the second integrated circuit having a second integrated circuit mounting surface substantially coplanar to the package in package mounting surface.

8. The method as claimed in claim 6 wherein connecting the second integrated circuit includes connecting the second integrated circuit over a die concealer adjacent the first integrated circuit package.

9. The method as claimed in claim 6 wherein forming the package in package lead includes forming the package in package lead in a shape of a J-bend lead.

10. The method as claimed in claim 6 wherein forming the package in package lead includes forming the package in package lead in a shape of a stackable lead having a top terminal and a bottom terminal.

11. An integrated circuit package in package system comprising:
   a package in package lead with a package in package lead surface substantially planar;
   a first integrated circuit package having a first package lead and a first encapsulant having a first encapsulant surface substantially coplanar with the package in package lead surface, the first package lead protruding from the first encapsulant;
   a second integrated circuit near the first integrated circuit package; and
   a package in package encapsulant over the first integrated circuit package and the second integrated circuit, a side of the package in package lead opposite the package in package lead surface exposed from the package in package encapsulant.

12. The system as claimed in claim 11 wherein the first integrated circuit package includes the first integrated circuit package electrically connected to the package in package lead.

13. The system as claimed in claim 11 wherein the second integrated circuit includes the second integrated circuit over the first integrated circuit package.

14. The system as claimed in claim 11 wherein the second integrated circuit includes the second integrated circuit adjacent the first integrated circuit package.

15. The system as claimed in claim 11 wherein the second integrated circuit includes a second integrated circuit package having the second integrated circuit adjacent the first integrated circuit package.

16. The system as claimed in claim 11 wherein:
   the package in package lead with the package in package lead surface is substantially planar to another package in package lead;
   the first integrated circuit package having a first encapsulant surface substantially coplanar with the package in package lead surface and another package in package lead surface;
   the second integrated circuit is connected to the first integrated circuit package with a second connector; and
   the package in package encapsulant is over the first integrated circuit package and the second integrated circuit, the package in package encapsulant having a plane of a package in package mounting surface substantially coplanar with the first encapsulant surface and the package in package lead surface.

17. The system as claimed in claim 16 wherein the second integrated circuit includes the second integrated circuit having a second integrated circuit mounting surface substantially coplanar to the package in package mounting surface.

18. The system as claimed in claim 16 wherein the second integrated circuit includes the second integrated circuit over a die concealer adjacent the first integrated circuit package.

19. The system as claimed in claim 16 wherein the package in package lead is in a shape of a J-bend lead.

20. The system as claimed in claim 16 wherein the package in package lead is in a shape of a stackable lead having a top terminal and a bottom terminal.

* * * * *